US011476255B2

(12) United States Patent
Yang

(10) Patent No.: US 11,476,255 B2
(45) Date of Patent: Oct. 18, 2022

(54) METHOD USED IN FORMING AN ARRAY OF VERTICAL TRANSISTORS AND METHOD USED IN FORMING AN ARRAY OF MEMORY CELLS INDIVIDUALLY COMPRISING A VERTICAL TRANSISTOR AND A STORAGE DEVICE ABOVE THE VERTICAL TRANSISTOR

(71) Applicant: Micron Technology, Inc., Boise, ID (US)

(72) Inventor: Guangjun Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 216 days.

(21) Appl. No.: 17/016,609

(22) Filed: Sep. 10, 2020

(65) Prior Publication Data
US 2022/0068934 A1 Mar. 3, 2022

Related U.S. Application Data

(60) Provisional application No. 63/071,453, filed on Aug. 28, 2020.

(51) Int. Cl.
*H01L 27/108* (2006.01)

(52) U.S. Cl.
CPC .. *H01L 27/10855* (2013.01); *H01L 27/10873* (2013.01); *H01L 27/10814* (2013.01); *H01L 27/10891* (2013.01)

(58) Field of Classification Search
None
See application file for complete search history.

(56) References Cited

U.S. PATENT DOCUMENTS

| 6,700,205 | B2 | 3/2004 | Tang et al. | |
|---|---|---|---|---|
| 2010/0087017 | A1* | 4/2010 | Masuoka | H01L 22/26 257/E21.528 |
| 2014/0021485 | A1* | 1/2014 | Cho | H01L 29/66666 257/77 |

OTHER PUBLICATIONS

Zahurak et al., "Process Integration of a 27nm, 16Gb Cu ReRAM", IEEE, United States, 2014, pp. 6.2.1-6.2.4.

* cited by examiner

*Primary Examiner* — Anthony Ho
*Assistant Examiner* — Kevin Quinto
(74) *Attorney, Agent, or Firm* — Wells St. John P.S.

(57) ABSTRACT

A method used in forming an array of vertical transistors comprises forming pillars individually comprising an upper source/drain region, a channel region vertically below the upper source/drain region, and sacrificial material above the upper source/drain region. Intervening material is about the sacrificial material of individual of the pillars. The intervening material and the sacrificial material comprise different compositions relative one another. Horizontally-elongated and spaced conductive gate lines are formed individually operatively aside the channel region of the individual pillars. The sacrificial material is removed to expose the upper source/drain region of the individual pillars and thereby form an opening in the intervening material directly above the upper source/drain region of the individual pillars. Metal material is formed in individual of the openings directly against the upper source/drain region of the individual pillars and atop the intervening material laterally outside of the openings. The metal material that is atop the intervening material interconnects the metal material that is in the individual openings. The metal material is removed back to have an uppermost surface that is no higher than an uppermost surface of the intervening material and to disconnect it from interconnecting the metal material that is in the individual openings and thereby form a laterally-isolated individual metal-material plug in the individual openings.

28 Claims, 9 Drawing Sheets

METHOD USED IN FORMING AN ARRAY OF VERTICAL TRANSISTORS AND METHOD USED IN FORMING AN ARRAY OF MEMORY CELLS INDIVIDUALLY COMPRISING A VERTICAL TRANSISTOR AND A STORAGE DEVICE ABOVE THE VERTICAL TRANSISTOR

TECHNICAL FIELD

Embodiments disclosed herein pertain to methods used in forming an array of vertical transistors and to methods used in forming an array of memory cells individually comprising a vertical transistor and a storage device above the vertical transistor.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines) The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

DETAILED DESCRIPTION OF EXAMPLE EMBODIMENTS

Embodiments of the invention include methods used in forming an array of vertical transistors, for example methods used in forming an array of memory cells individually comprising a vertical transistor and a storage device above the vertical transistor. Example method embodiments of forming an array of memory cells are described with reference to FIGS. 1-27.

Figure 3:
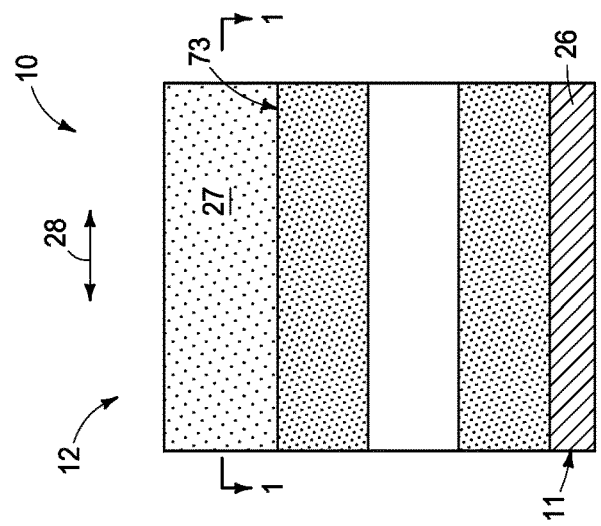
FIG. 3 is a diagrammatic cross-sectional view taken through line 3-3 in FIG. 1.
Figure 2:
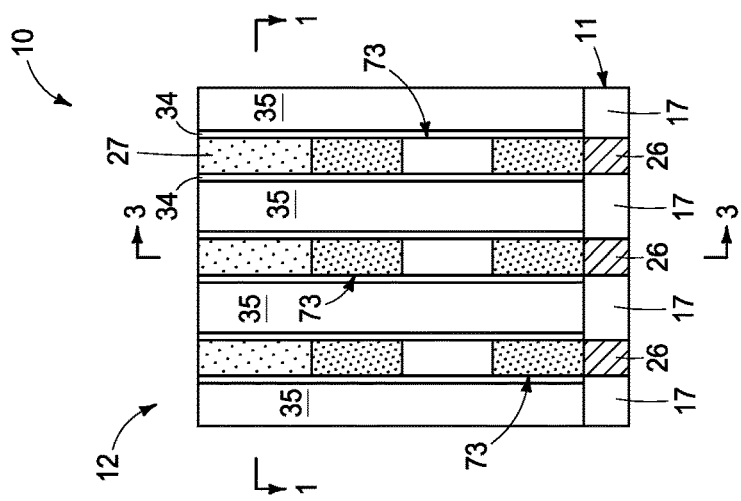
FIG. 2 is a diagrammatic cross-sectional view taken through line 2-2 in FIG. 1.
Figure 1:
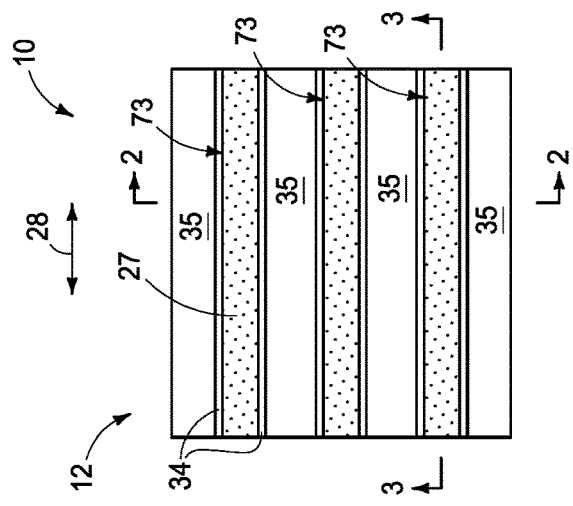
FIG. 1 is a diagrammatic cross-sectional view of a portion of a substrate in process in accordance with an embodiment of the invention and is taken through line 1-1 in FIGS. 2 and 3.

Referring to FIGS. 1-3, such show a portion of a substrate construction 10 comprising a base substrate 11 comprising any one or more of conductive/conductor/conducting, semi-conductive/semiconductor/semiconducting, and insulative/insulator/insulating (i.e., electrically herein) materials. Various materials may be formed elevationally over and within base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. With respect to memory circuitry, control and/or other peripheral circuitry for operating components within an array of memory cells may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Example base substrate 11 is shown as comprising horizontally-elongated and spaced conductive digitlines 26 that individually interconnect a respective multiple of vertical transistors (not yet shown) in a direction 28 (e.g., a column direction). Insulating material 17 (e.g., silicon nitride and/or silicon dioxide) is between digitlines 26. Lines 73 have been formed atop digitlines 26 and insulating material 17. Lines 73 comprise material that is suitable for formation of source/drain regions and channel regions of vertical transistors as will be apparent from the continuing discussion. By way of example only, polysilicon is one such material and, regardless, that may or may not be appropriately doped at a final concentration of conductivity-modifying impurity at this point in the process if ultimately so-doped. Sacrificial material 27 (e.g., silicon nitride) that is co-extensive with lines 73 is there-atop (e.g., thickness of 200 to 300 Angstroms). Insulating materials 34 and 35 are shown between lines 73 and sacrificial material 27. Example materials are silicon oxycarbide (34) and silicon dioxide (35; e.g., resulting from a spin-on-dielectric and associated processing).

Figure 6:
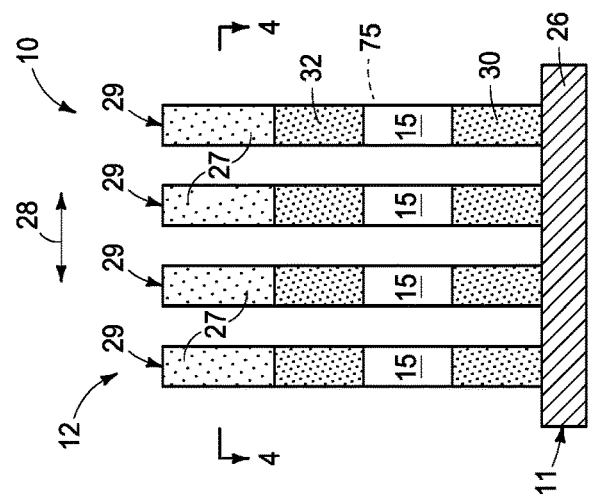
FIGS. 4-27 are diagrammatic sequential sectional, expanded, enlarged, and/or partial views of the construction of FIGS. 1-3, or portions thereof, or alternate embodiments, in process in accordance with some embodiments of the invention.
Figure 5:
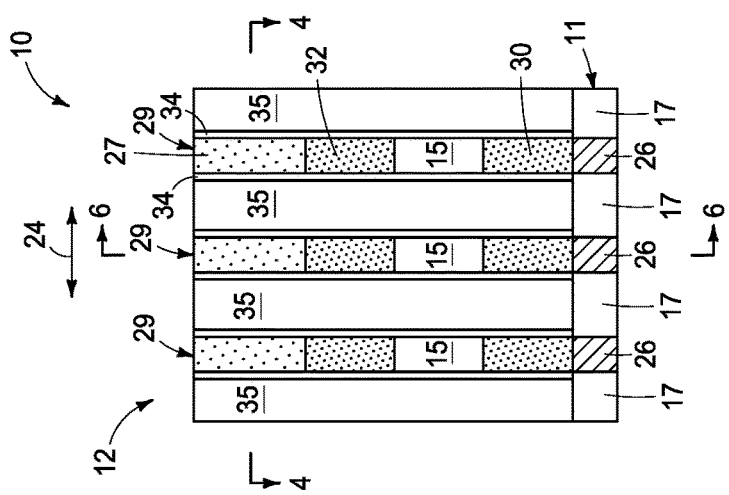
Figure 4:
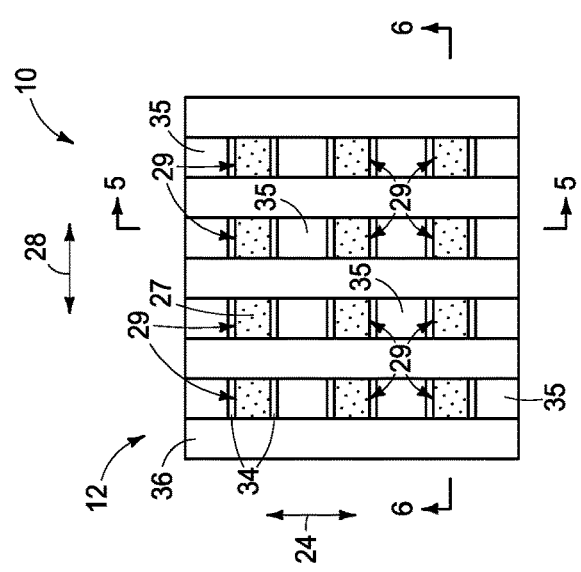

Referring to FIGS. 4-6, material of lines 33 of FIG. 1-3, material 27, and materials 34 and 35 have been patterned in a direction 24 (e.g., a row direction) thereby forming pillars 29 that are atop and directly electrically coupled to individual digitlines 26. More sacrificial material 27 may have been deposited atop the structure of FIG. 1-3 prior to the processing of FIG. 4-6 (not shown) whereby row lines (not shown) of sacrificial material 27 extend in direction 24 atop pillars 29. Regardless, pillars 29 comprise an upper source/drain region 32 and a channel region 15 vertically there-below. In one embodiment and as shown, pillars 29 also comprise lower source/drain region 30 vertically below channel region 15. Alternately and by way of example only, pillars 29 may not comprise a lower source/drain region, with such being an intrinsic part of an uppermost portion of the individual digitline 26 immediately there-below (not shown). Pillars 29 also comprise sacrificial material 27 above upper source/drain region 32. In one embodiment, upper source/drain region 32 comprises conductively-doped semiconductive material, with sacrificial material 27 being directly there-against.

Figure 9:
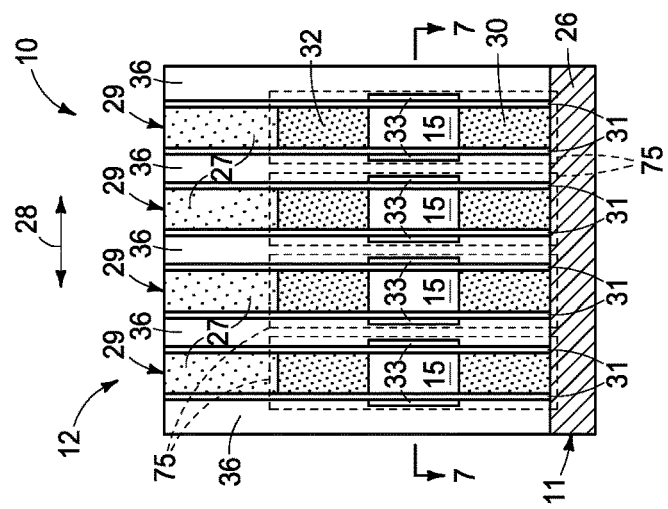
Figure 8:
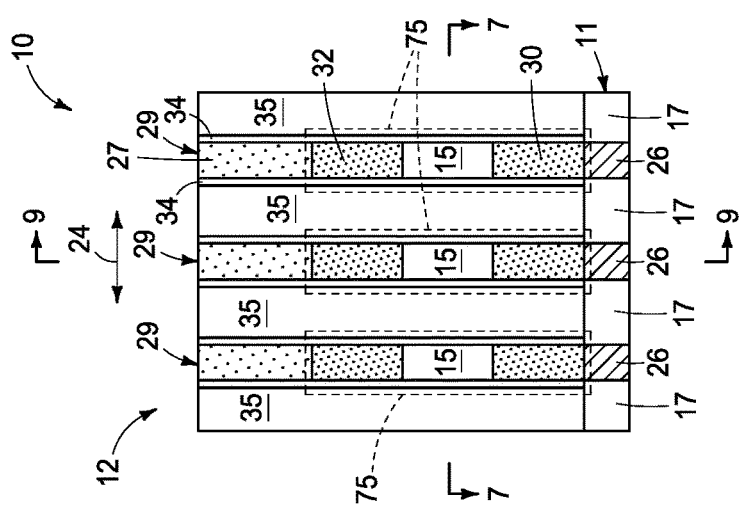
Figure 7:
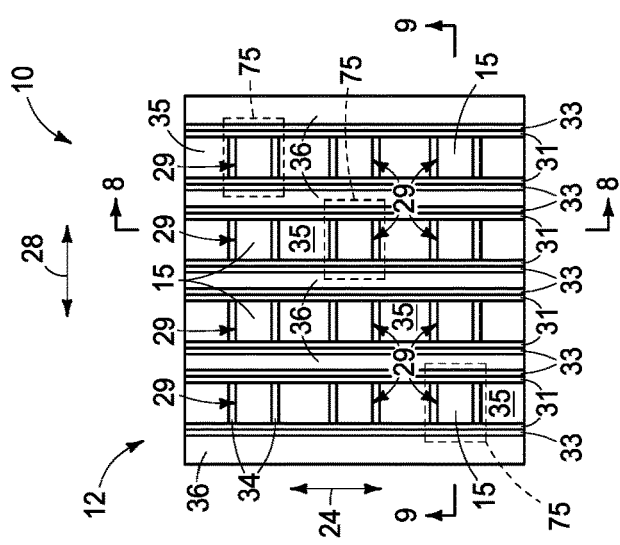

Referring to FIGS. 7-9, horizontally-elongated and spaced conductive gate lines 33 have been formed individually operatively aside channel region 15 of individual pillars 29. A gate insulator 31 (e.g., silicon dioxide and/or silicon nitride) has been formed aside pillars 29 prior to forming gate lines 33 (e.g., some or all of insulator material 34 having been previously removed). Gate lines 33 may largely be formed in a self-aligned manner, for example depositing such as a conformal layer aside depicted pillars 29, followed by maskless anisotropic etching thereof to substantially remove such from being over horizontal surfaces. Such may or may not laterally overlap some of the upper and lower source/drain regions. Regardless, a top terminus of gate lines 33 may be determined by timed etching of material of such gate lines. A bottom terminus may be determined, for example, by deposition of insulating and/or sacrificial material (not shown) to have a top that is at the desired bottom terminus of conductive gate lines 33. Regardless, subsequent processing is shown that includes deposition of insulating material 36 (e.g., a combination of silicon oxycarbide and silicon dioxide deposited by spin-on-dielectric processing as with respect to materials 34 and 35, respectively). FIGS. 7-9 show example processing whereby individual vertical transistors 75 have been formed, with gate lines 33 individually interconnecting a respective plurality of vertical transistors 75 in direction 24 (e.g., row direction 24).

The above processing is but one example of forming pillars 29 that are atop and directly electrically coupled to individual digitlines 26 and having intervening material (e.g., 31, 34/35, 36) about sacrificial material 27 of individual pillars 29. Intervening material 31, 34/35, 36 and sacrificial material 27 comprise different compositions relative one another. Any other technique may be used. In one embodiment and as shown, intervening material 31, 34/35, 36 comprises first intervening material 31, 34/35 and second intervening material 36 that each comprise a different composition from that of sacrificial material 27. Second intervening material 36 is formed after forming gate lines 33. In one such embodiment, first intervening material 31, 34/35 is formed before forming gate lines 33 and second intervening material 36 is formed after forming first intervening material 34/35.

Figure 12:
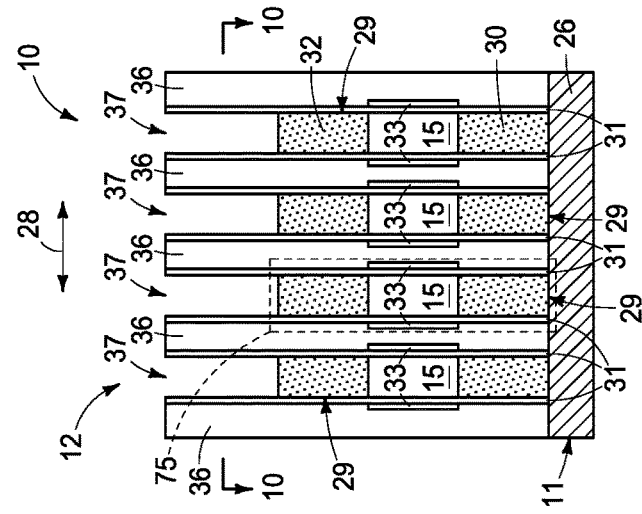
Figure 11:
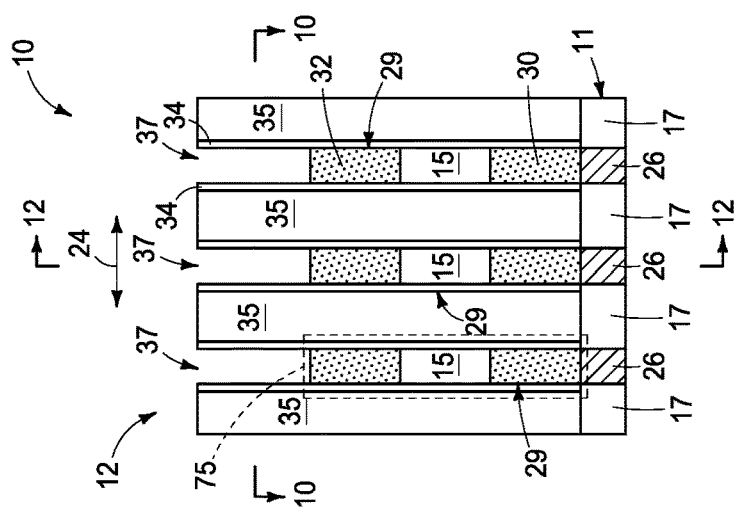
Figure 10:
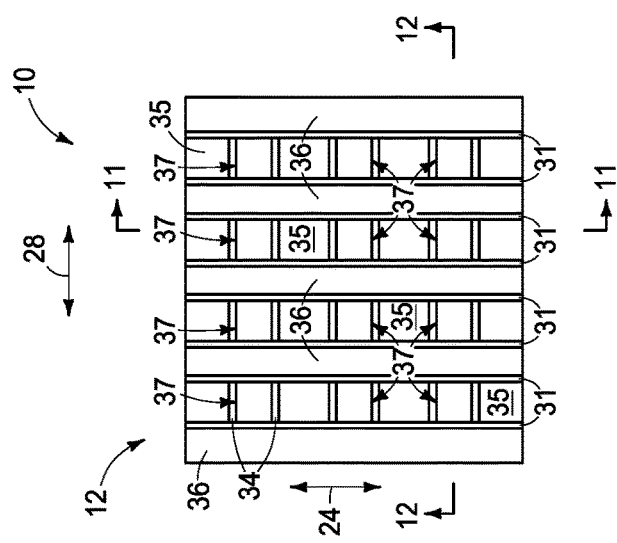

Referring to FIGS. 10-12, sacrificial material 27 (not shown) has been removed (e.g., by selective isotropic or anisotropic etching) to expose upper source/drain region 32 of individual pillars 29 and thereby form an opening 37 in intervening material 31, 34/35, 36 directly above upper source/drain region 32 of individual pillars 29.

Figure 15:
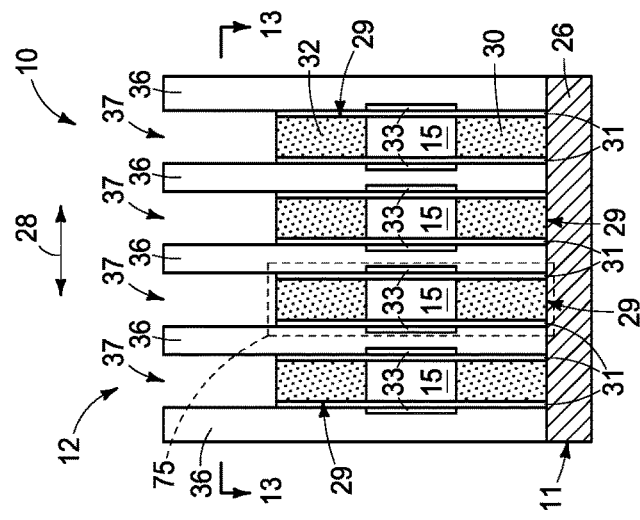
Figure 14:
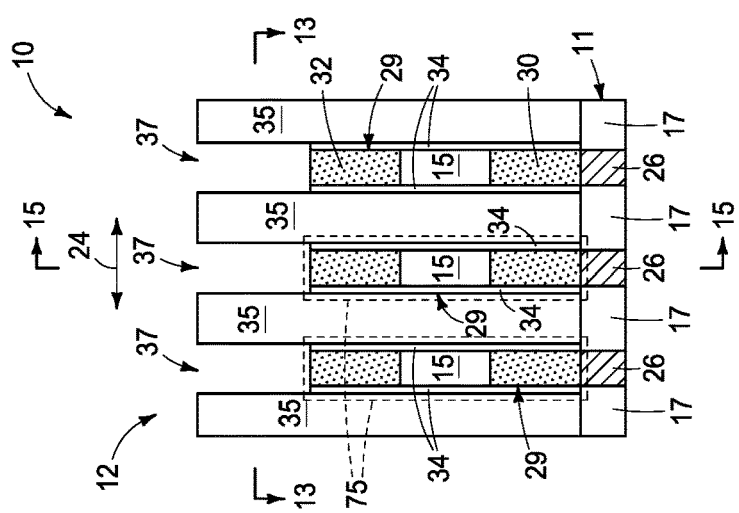
Figure 13:
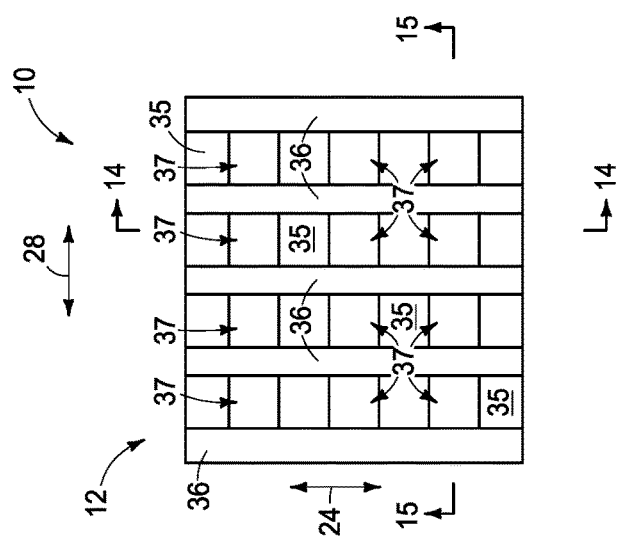

Referring to FIGS. 13-15, individual openings 37 have been laterally-widened (e.g., by isotropic etching) above upper source/drain region 32 in one vertical cross-section (e.g., that of FIG. 15 and in direction 28) after their initial formation. In one such embodiment and as shown, individual openings 37 have been laterally widened above upper source/drain region 32 in an other vertical cross-section that is orthogonal to the one vertical cross-section after their initial formation (e.g., that of FIG. 14 and along direction 24). In one such latter embodiment, such laterally-widening in the one and the another vertical cross-sections occurs at the same time (e.g., by isotropic etching).

Figure 18:
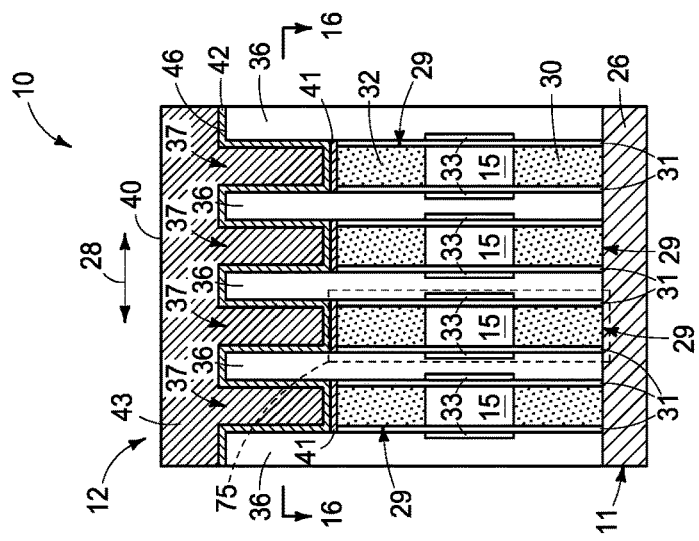
Figure 17:
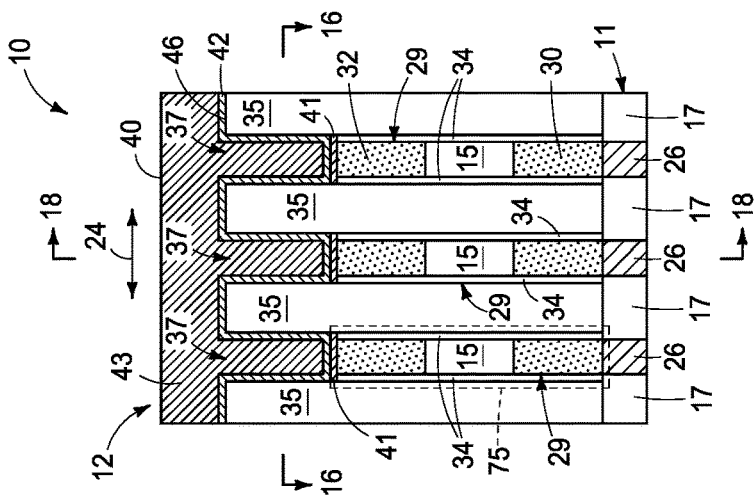
Figure 16:
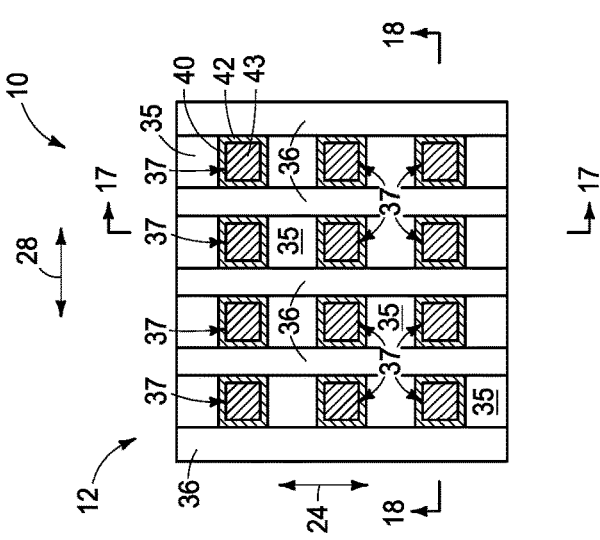

Referring to FIGS. 16-18, metal material 40 has been formed in individual openings 37 directly against upper source/drain region 32 of individual pillars 29 and atop intervening material 31, 34/35, 36 laterally outside of openings 37 (e.g., atop an uppermost surface 46 thereof). Metal material 40 that is atop intervening material 31, 34/35, 36 interconnects the metal material 40 that is in individual openings 37. In one embodiment, metal material 40 comprises titanium nitride 42 and elemental tungsten 43 and in one such embodiment comprises a metal silicide 41 (e.g., $WSi_x$ there-under), with such metal silicide 41 being directly against titanium nitride 42. Regardless, in one embodiment and as shown, metal material 40 is formed atop second intervening material 36, with uppermost surface 46 of the intervening material comprising that of second intervening material 36. Also, in one embodiment, the first intervening material is formed before forming the gate lines, the second intervening material is formed after forming the first intervening material, the metal material is formed atop the first intervening material, and the uppermost surface of the intervening material comprises that of the first intervening material.

Figure 21:
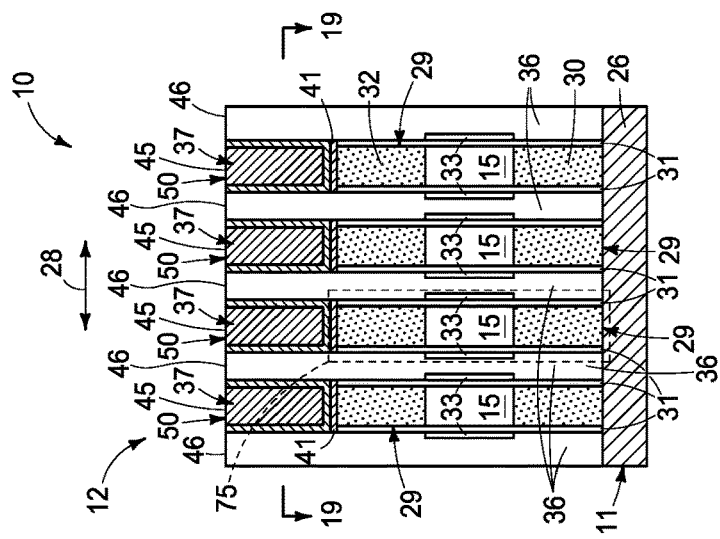
Figure 20:
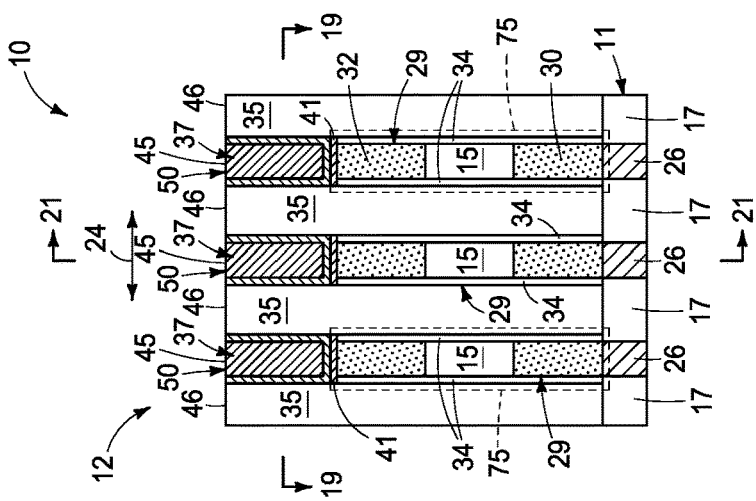
Figure 19:
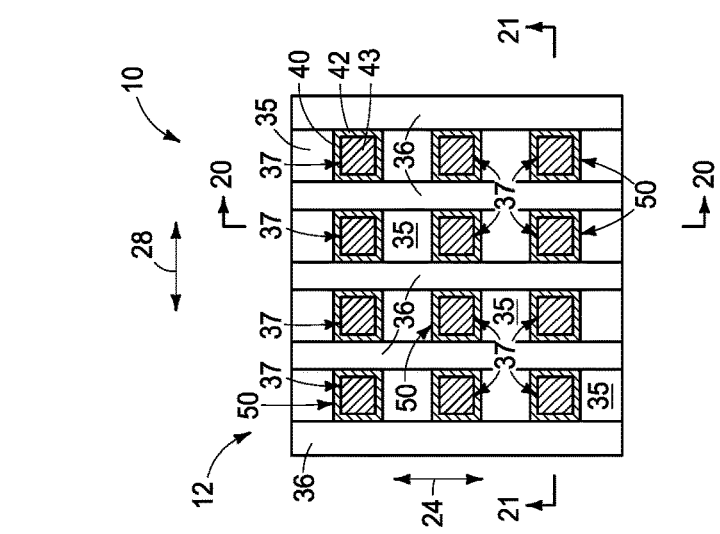

Referring to FIGS. 19-21, metal material 40 has been removed back (e.g., by chemical mechanical polishing, resist etch-back, or other etch-back) to have an uppermost surface 45 that is no higher than an uppermost surface 46 of intervening material 31, 34/35, 36 and to disconnect it from interconnecting metal material 40 that is in individual openings 37 and thereby form a laterally-isolated individual metal-material plug 50 in individual openings 37. Such thereby in one embodiment shows an example method of forming metal-material plugs 50 in a manner that is entirely self-aligned circumferentially in a horizontal cross-section (e.g., that of FIG. 19, and with there being no additional subtractive patterning of metal material 40 with a mask above intervening material 31, 34/35, 36 in array area 12). Uppermost surface 46 of intervening material 31, 34/35, 36 may move down during such removing of metal material 40 (not shown). Regardless, and in one embodiment, uppermost surface 45 of metal material 40 and uppermost surface 46 of intervening material 31, 34/35, 36 after the removing of metal material 40 back are each planar, and in one such embodiment are co-planar. Alternately, and by way of examples only, the top surface of metal material 40 may be below the top surface of intervening material 31, 34/35, 36 regardless of whether either is planar (not shown). Regardless, and in one embodiment as shown, the removing of metal material 40 back removes all of such metal material from being atop intervening material 31, 34/35, 36. In one embodiment, metal material 40 and upper source/drain region 32 are of different compositions relative one another.

Figure 24:
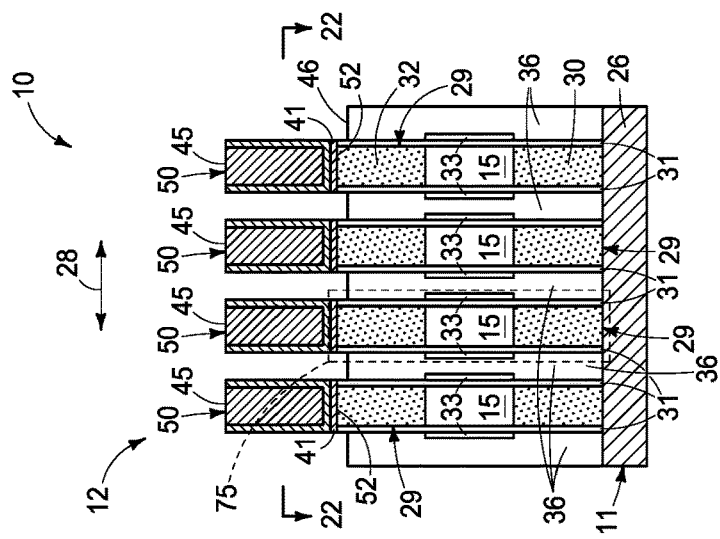
Figure 23:
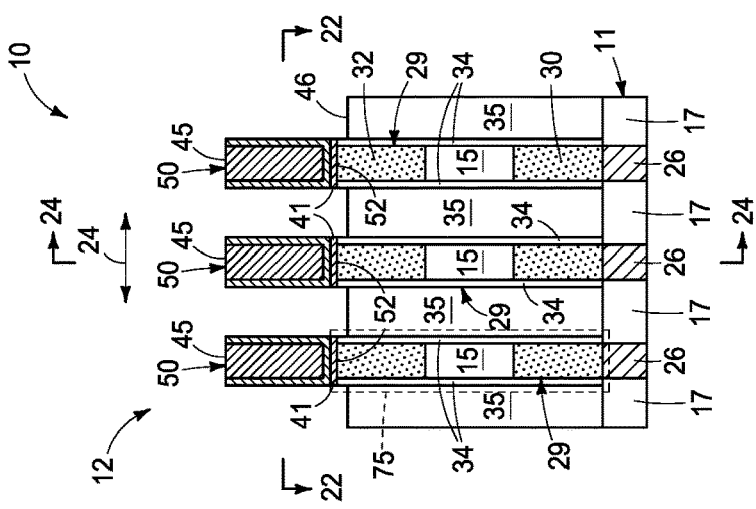
Figure 22:
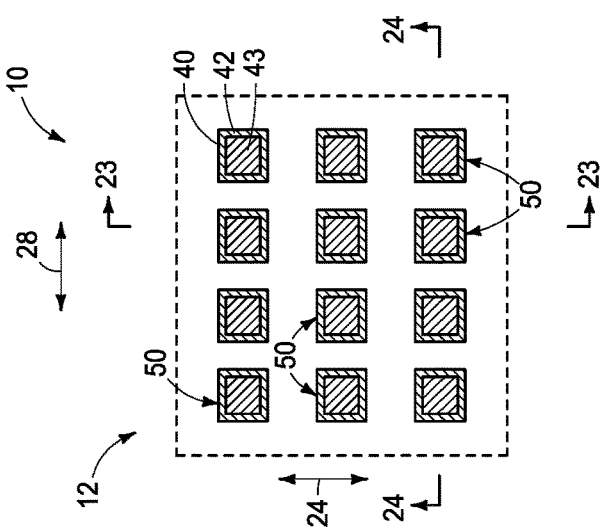

Referring to FIGS. 22-24, and after forming laterally-isolated individual metal-material plugs 50, intervening material 31, 34/35, 36 has been vertically etched selectively relative to metal-material plugs 50, and in one such embodiment to form uppermost surface 46 of intervening material 31, 34/35, 36 to be below a bottom 52 of metal-material plugs 50.

Figure 27:
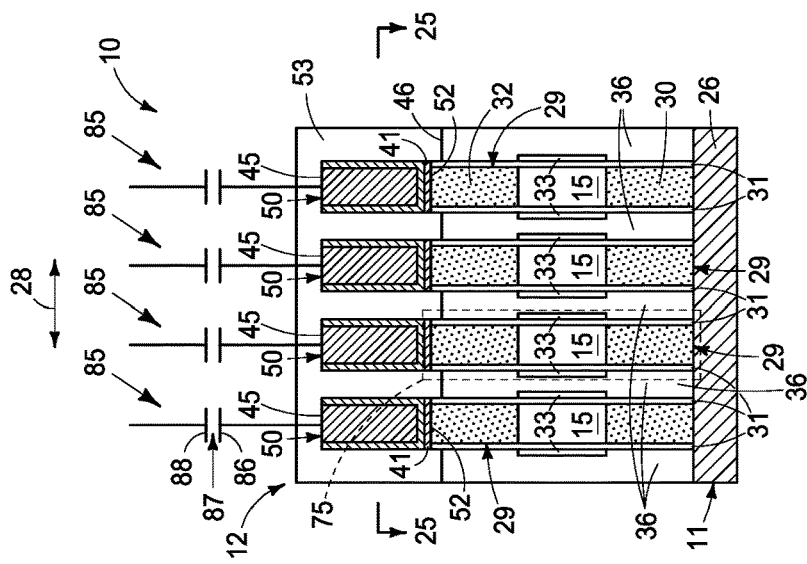
Figure 26:
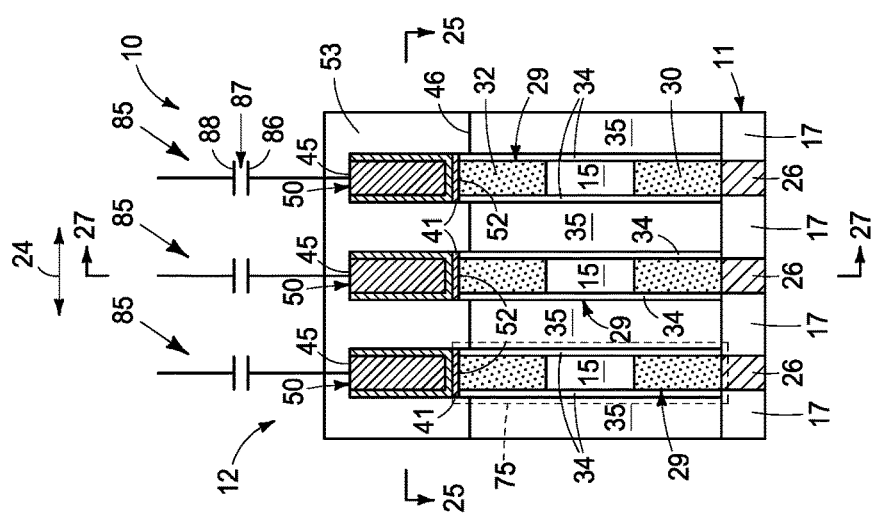
Figure 25:
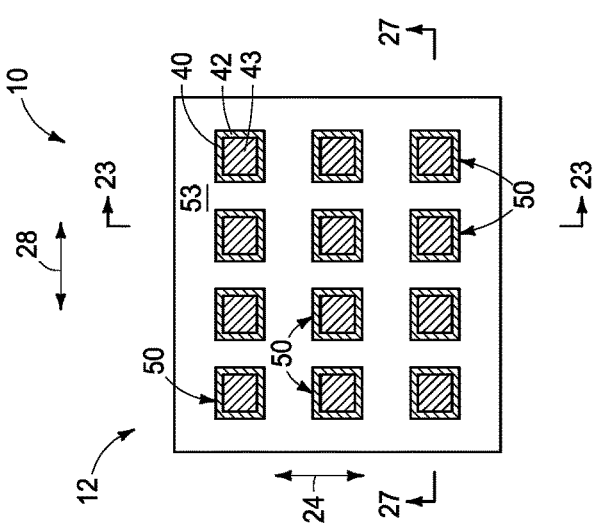

Referring to FIGS. 25-27, and in one embodiment, silicon nitride 53 has been formed in place of the removed vertically-etched intervening material 31, 34/35, 36. Regardless, and in one embodiment after removing metal material 40 to form metal-material plugs 50, storage devices 85 are formed that are individually above and electrically coupled to (e.g., directly electrically coupled to) one of individual metal-material plugs 50. Any suitable storage device may be used, with storage devices 85 schematically being shown as being capacitors having a lower capacitor electrode 86, an upper capacitor electrode 88, and a capacitor insulator 87 therebetween. By way of example only, upper capacitor electrode 88 may be a capacitor electrode plate or line common to all capacitors within array 12.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

In this document, "self-aligned" means a technique whereby at least a lateral surface of a structure is defined by deposition of material against a sidewall of a previously patterned structure. In the context of this document, "circumferentially self-aligned" is a self-aligned technique whereby all lateral surfaces of a structure are defined by deposition of material against an encircling sidewall of a previously patterned structure.

Unless otherwise indicated, use of "or" herein encompasses either and both.

CONCLUSION

In some embodiments, a method used in forming an array of vertical transistors comprises forming pillars individually comprising an upper source/drain region, a channel region vertically below the upper source/drain region, and sacrificial material above the upper source/drain region. Intervening material is about the sacrificial material of individual of the pillars. The intervening material and the sacrificial material comprise different compositions relative one another. Horizontally-elongated and spaced conductive gate lines are formed individually operatively aside the channel region of the individual pillars. The sacrificial material is removed to expose the upper source/drain region of the individual pillars and thereby form an opening in the intervening material directly above the upper source/drain region of the individual pillars. Metal material is formed in individual of the openings directly against the upper source/drain region of the individual pillars and atop the intervening material laterally outside of the openings. The metal material that is atop the intervening material interconnects the metal material that is in the individual openings. The metal material is removed back to have an uppermost surface that is no higher than an uppermost surface of the intervening material and to disconnect it from interconnecting the metal material that is in the individual openings and thereby form a laterally-isolated individual metal-material plug in the individual openings.

In some embodiments, a method used in forming an array of vertical transistors comprises forming pillars individually comprising an upper source/drain region, a channel region vertically below the upper source/drain region, and sacrificial material above the upper source/drain region. Intervening material is about the sacrificial material of individual of the pillars. The intervening material and the sacrificial material comprise different compositions relative one another. Horizontally-elongated and spaced conductive gate lines are formed individually operatively aside the channel region of the individual pillars. The sacrificial material is removed to expose the upper source/drain region of the individual pillars and thereby form an opening in the intervening material directly above the upper source/drain region of the individual pillars. Individual of the openings are laterally-widened above the upper source/drain region in one vertical cross-section after their initial formation. Metal material is formed in the individual widened openings directly against the upper source/drain region of the individual pillars and atop the intervening material laterally outside of the widened openings. The metal material that is atop the intervening material interconnects the metal material that is in the individual widened openings. The metal material is removed back to have an uppermost surface that is no higher than an uppermost surface of the intervening material and to disconnect it from interconnecting the metal material that is in the individual openings and thereby forms a laterally-isolated individual metal-material plug in the individual openings. The metal material and the upper source/drain region are of different compositions relative one another. The metal material is removed back and all of the metal material is removed from being atop the intervening material. The uppermost surface of the metal material and the uppermost surface of the intervening material after removing the metal material back are coplanar. After forming the laterally-isolated individual metal-material plugs, the intervening material is vertically etched selectively relative to said metal-material plugs.

In some embodiments, a method used in forming an array of memory cells individually comprising a vertical transistor and a storage device above the vertical transistor comprises forming horizontally-elongated and spaced digitlines that individually interconnect a respective multiple of the vertical transistors in a column direction. Pillars are formed that are atop and directly electrically coupled to individual of the digitlines. The pillars individually comprise an upper source/drain region, a channel region vertically below the upper source/drain region, and sacrificial material above the upper source/drain region. Intervening material is about the sacrificial material of individual of the pillars. The intervening material and the sacrificial material comprise different compositions relative one another. Horizontally-elongated and spaced conductive gate lines are formed individually operatively aside the channel region of the individual pillars and that individually interconnect a respective plurality of the vertical transistors in a row direction. The sacrificial material is removed to expose the upper source/drain region of the individual pillars and thereby form an opening in the intervening material directly above the upper source/drain region of the individual pillars. Metal material is formed in individual of the openings directly against the upper source/drain region of the individual pillars and atop the intervening material laterally outside of the openings. The metal material that is atop the intervening material interconnects the metal material that is in the individual openings. The metal material is removed back to have an uppermost surface that is no higher than an uppermost surface of the intervening material and to disconnect it from interconnecting the metal material that is in the individual openings and thereby forms a laterally-isolated individual metal-material plug in the individual openings. After removing the metal material, storage devices are formed that are individually above and electrically coupled to one of the individual metal-material plugs.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of vertical transistors, comprising:

forming pillars individually comprising an upper source/drain region, a channel region vertically below the upper source/drain region, and sacrificial material above the upper source/drain region; intervening material about the sacrificial material of individual of the pillars, the intervening material and the sacrificial material comprising different compositions relative one another;

forming horizontally-elongated and spaced conductive gate lines individually operatively aside the channel region of the individual pillars;

removing the sacrificial material to expose the upper source/drain region of the individual pillars and thereby form an opening in the intervening material directly above the upper source/drain region of the individual pillars;

forming metal material in individual of the openings directly against the upper source/drain region of the individual pillars and atop the intervening material laterally outside of the openings, the metal material that is atop the intervening material interconnecting the metal material that is in the individual openings; and removing the metal material back to have an uppermost surface that is no higher than an uppermost surface of the intervening material and to disconnect it from interconnecting the metal material that is in the individual openings and thereby form a laterally-isolated individual metal-material plug in the individual openings.

2. The method of claim 1 wherein the upper source/drain region comprises conductively-doped semiconductive material, the sacrificial material being directly against the conductively-doped semiconductive material.

3. The method of claim 1 comprising, after forming the openings and before forming the metal material therein, laterally-widening the individual openings above the upper source/drain region in one vertical cross-section after their initial formation.

4. The method of claim 3 comprising, after forming the openings and before forming the metal material therein, laterally-widening the individual openings above the upper source/drain region in another vertical cross-section that is orthogonal to the one vertical cross-section after their initial formation.

5. The method of claim 4 wherein the laterally-widening in the one and the another vertical cross-sections occur at the same time.

6. The method of claim 1 wherein the metal material comprises titanium nitride and elemental tungsten.

7. The method of claim 6 wherein the metal material comprises a metal silicide under the titanium nitride and the elemental tungsten.

8. The method of claim 7 wherein the metal silicide is directly against the titanium nitride.

9. The method of claim 1 wherein the uppermost surface of the metal material and the uppermost surface of the intervening material after the removing the metal material back are each planar.

10. The method of claim 9 wherein the uppermost surface of the metal material and the uppermost surface of the intervening material after the removing the metal material back are coplanar.

11. The method of claim 1 comprising, after forming the laterally-isolated individual metal-material plugs, vertically etching the intervening material selectively relative to said metal-material plugs.

12. The method of claim 11 wherein the vertically etching of the intervening material forms its uppermost surface to be below a bottom of said metal-material plugs.

13. The method of claim 1 wherein,
the intervening material comprises first intervening material and second intervening material that each comprise a different composition from that of the sacrificial material;
the second intervening material is formed after forming the gate lines, the metal material being formed atop the second intervening material, said uppermost surface of the intervening material comprising that of the second intervening material.

14. The method of claim 13 wherein the first intervening material is formed before forming the gate lines, the second intervening material is formed after forming the first intervening material, the metal material is formed atop the first intervening material, and said uppermost surface of the intervening material comprising that of the first intervening material.

15. The method of claim 1 wherein the metal material and the upper source/drain region are of different compositions relative one another.

16. The method of claim 1 wherein the removing the metal material back removes all of the metal material from being atop the intervening material.

17. The method of claim 1 wherein,
the gate lines individually interconnect a respective plurality of the vertical transistors in a row direction; and
prior to forming the gate lines, forming horizontally-elongated and spaced conductive lines that individually interconnect a respective multiple of the vertical transistors in a column direction.

18. The method of claim 1 wherein the metal-material plugs are formed to be circumferentially self-aligned in a horizontal cross-section.

19. A method used in forming an array of vertical transistors, comprising:
forming pillars individually comprising an upper source/drain region, a channel region vertically below the upper source/drain region, and sacrificial material above the upper source/drain region; intervening material being about the sacrificial material of individual of the pillars, the intervening material and the sacrificial material comprising different compositions relative one another;
forming horizontally-elongated and spaced conductive gate lines individually operatively aside the channel region of the individual pillars;
removing the sacrificial material to expose the upper source/drain region of the individual pillars and thereby form an opening in the intervening material directly above the upper source/drain region of the individual pillars;
laterally-widening individual of the openings above the upper source/drain region in one vertical cross-section after their initial formation;
forming metal material in the individual widened openings directly against the upper source/drain region of the individual pillars and atop the intervening material laterally outside of the widened openings, the metal material that is atop the intervening material interconnecting the metal material that is in the individual widened openings;
removing the metal material back to have an uppermost surface that is no higher than an uppermost surface of the intervening material and to disconnect it from interconnecting the metal material that is in the individual openings and thereby form a laterally-isolated individual metal-material plug in the individual openings, the metal material and the upper source/drain region being of different compositions relative one another, the removing the metal material back removing all of the metal material from being atop the intervening material, the uppermost surface of the metal material and the uppermost surface of the intervening material after the removing the metal material back being coplanar;
after forming the laterally-isolated individual metal-material plugs, vertically etching the intervening material selectively relative to said metal-material plugs.

20. A method used in forming an array of memory cells individually comprising a vertical transistor and a storage device above the vertical transistor, comprising:
forming horizontally-elongated and spaced digitlines that individually interconnect a respective multiple of the vertical transistors in a column direction;
forming pillars that are atop and directly electrically coupled to individual of the digitlines; the pillars individually comprising an upper source/drain region, a channel region vertically below the upper source/drain region, and sacrificial material above the upper source/drain region; intervening material about the sacrificial material of individual of the pillars, the intervening material and the sacrificial material comprising different compositions relative one another;
forming horizontally-elongated and spaced conductive gate lines individually operatively aside the channel region of the individual pillars and that individually interconnect a respective plurality of the vertical transistors in a row direction;
removing the sacrificial material to expose the upper source/drain region of the individual pillars and thereby form an opening in the intervening material directly above the upper source/drain region of the individual pillars;
forming metal material in individual of the openings directly against the upper source/drain region of the individual pillars and atop the intervening material laterally outside of the openings, the metal material that is atop the intervening material interconnecting the metal material that is in the individual openings;
removing the metal material back to have an uppermost surface that is no higher than an uppermost surface of the intervening material and to disconnect it from interconnecting the metal material that is in the individual openings and thereby form a laterally-isolated individual metal-material plug in the individual openings; and
after removing the metal material, forming storage devices that are individually above and electrically coupled to one of the individual metal-material plugs.

21. The method of claim 20 wherein the storage devices are capacitors.

22. The method of claim 20 comprising:
after forming the laterally-isolated individual metal-material plugs, vertically etching the intervening material selectively relative to said metal-material plugs;
forming silicon nitride in place of the vertically-etched intervening material; and
forming the storage devices above the silicon nitride.

23. The method of claim 22 wherein the vertically etching of the intervening material forms its uppermost surface to be below a bottom of said metal-material plugs.

24. The method of claim 20 comprising, after forming the openings and before forming the metal material therein, laterally-widening the individual openings above the upper source/drain region in one vertical cross-section after their initial formation.

25. The method of claim 20 wherein the uppermost surface of the metal material and the uppermost surface of the intervening material after the removing the metal material back are each planar.

26. The method of claim 25 wherein the uppermost surface of the metal material and the uppermost surface of the intervening material after the removing the metal material back are coplanar.

27. The method of claim 20 wherein,
the intervening material comprises first intervening material and second intervening material that comprises a different composition from that of the sacrificial material;
the second intervening material is formed after forming the gate lines, the metal material being formed atop the second intervening material, said uppermost surface of the intervening material comprising that of the second intervening material.

28. The method of claim 27 wherein the first intervening material is formed before forming the gate lines, the second intervening material is formed after forming the first intervening material, the metal material is formed atop the first intervening material, and said uppermost surface of the intervening material comprising that of the first intervening material.

\* \* \* \* \*